United States Patent
Dautartas

(10) Patent No.: US 6,274,198 B1
(45) Date of Patent: Aug. 14, 2001

(54) SHADOW MASK DEPOSITION

(75) Inventor: Mindaugas Fernand Dautartas, Alburtis, PA (US)

(73) Assignee: Agere Systems Optoelectronics Guardian Corp., Orlando, FL (US)

( * ) Notice: Subject to any disclaimer, the term of this patent is extended or adjusted under 35 U.S.C. 154(b) by 365 days.

(21) Appl. No.: 08/805,404

(22) Filed: Feb. 24, 1997

(51) Int. Cl.[7] ............................... B05D 5/00; B05D 3/00
(52) U.S. Cl. .............................. 427/282; 427/58; 427/96; 427/307; 427/309; 118/504; 430/22; 438/944
(58) Field of Search ............................... 427/58, 96, 256, 427/282, 307, 309; 430/5, 22, 311, 312; 438/943, 944; 118/504, 505

(56) References Cited

U.S. PATENT DOCUMENTS

| | | | | |
|---|---|---|---|---|
| 4,256,532 | * | 3/1981 | Magdo et al. | 156/628 |
| 4,271,577 | * | 6/1981 | Kosugi | 29/238 |
| 4,565,314 | * | 1/1986 | Scholz | 228/180.2 |
| 4,625,561 | * | 12/1986 | Mikkor | 73/724 |
| 5,120,421 | * | 6/1992 | Glass et al. | 204/406 |

* cited by examiner

Primary Examiner—Shrive Beck
Assistant Examiner—Michael Barr
(74) Attorney, Agent, or Firm—Lester H. Birnbaum

(57) ABSTRACT

A method of depositing material on a substrate using a shadow mask. The mask includes a plurality of etched features which correspond to a plurality of features in the substrate. Spheres are provided in the features of the mask or substrate so that the mask and substrate are aligned when each of the spheres occupy both of the corresponding features in the mask and substrate.

8 Claims, 4 Drawing Sheets

SHADOW MASK DEPOSITION

FIELD OF THE INVENTION

This invention relates to the deposition of material on a substrate using a shadow mask.

BACKGROUND OF THE INVENTION

Many types of electronic components and circuits require a nonplanar substrate surface. For example, in the field of optoelectronics, channels are often etched on the surface of a silicon substrate in order to provide mounting of optical components or to increase coupling efficiency between the components. (See, e.g., U.S. Patent Application of Anigbo et al, Ser. No. 60/009116, filed Dec. 22, 1995, which is incorporated by reference herein.) In many cases, these nonplanar surfaces require a metal coating which, for example, acts as a reflecting layer. Since these metal layers are usually patterned, a mask should be employed on the substrate surface. Typically, the mask employed for patterning metal on a planar substrate surface is a photoresist material. However, when the surface is nonplanar, difficulties can be encountered in depositing and cleaning off the photoresist material.

In the fabrication of planar integrated circuits, it is known in general to employ masks made of metal (e.g., molybdenum) on the substrate, a technology usually referred to as shadow masking. This technique has lost favor in the industry due to the inability to achieve accurate registration.

It is desirable to provide a shadow mask technique which can be used for depositing metal on a nonplanar or planar substrate and achieve accurate registration.

It is known in general to position two components by forming conical bores in the facing surfaces and provide spheres in the bores. (See U.S. Pat. No. 4,070,120 issued to Bald et al.) It is also known to position silicon IC chips onto silicon or ceramic substrates by etching V-grooves in the substrate which correspond to contact pads on the chip having spheroidal solder or gold so that the solder or gold will be located within a corresponding groove. (See U.S. Pat. No. 3,379,937 issued to Shepherd and U.S. Pat. No. 4,288,808 issued to Hantusch.) It has been further suggested to position a ceramic chip carrier or a silicon chip on a printed circuit board by forming indentations in both the chip and substrate and employing spherical bodies in the indentations. The indentations can be pyramid shaped. (See, U.S. Pat. No. 3,184,831 issued to Siebertz, and U.S. Pat. No. 4,565,314 issued to Scholz.)

The art does not appear to have addressed the problem of how to deposit a metal onto a nonplanar or planar substrate by means of shadow masking to achieve accurate registration.

SUMMARY OF THE INVENTION

The invention is a method of depositing a material on a substrate including the step of providing a semiconductor mask with an aperture for defining the area of the substrate to be covered by the material. The mask further comprises a plurality of etched features in a major surface of the mask, which features are pyramidal. A major surface of the substrate also includes pyramidal shaped features. The mask is positioned so that the major surfaces are facing one another with spheres located in the features of one of the major surfaces, and the mask is moved until the spheres are positioned in corresponding features in both the mask and the substrate so that the mask is aligned with the substrate. The material is then deposited onto the substrate through the aperture.

BRIEF DESCRIPTION OF THE DRAWING

These and other features of the invention are delineated in detail in the following description. In the drawing.

It will be appreciated that, for purposes of illustration, these figures are not necessarily drawn to scale.

Figure 1:
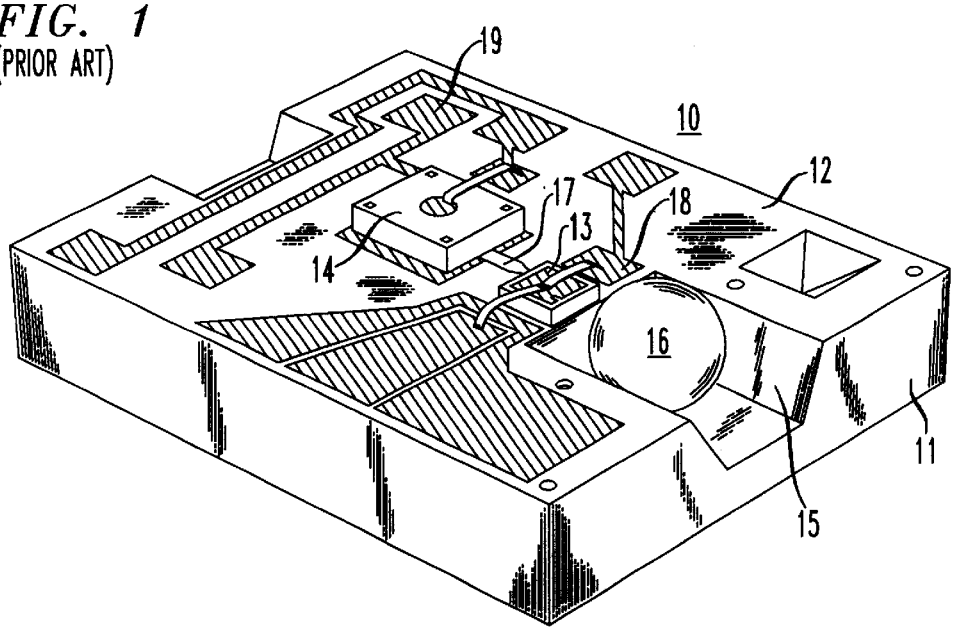
FIG. 1 is a perspective view of an optical subassembly which may be fabricated in accordance with the invention.

Detailed Description Referring now to the drawings, in which like reference numerals identify similar or identical elements, FIG. 1 illustrates an optical subassembly, 10, which may be fabricated in accordance with the invention. The subassembly is formed on a substrate, 11, which is typically silicon. The substrate, 11, includes a major surface, 12, which has mounted thereon a semiconductor laser, 13, and a photodiode, 14, for monitoring light emitted from the back face of the laser, 13. In between the laser, 13, and the photodiode, 14, is a channel, 17, etched in the substrate. The channel is used to reflect a portion of the laser light onto the photodiode. (See U.S. Patent Application of Anigbo Ser. No. 60/009116, filed Dec. 22, 1995, which is incorporated by reference herein.) The substrate, 11, also includes a cavity, 15, within which is mounted a lens, 16, for focusing the laser light onto an optical fiber (not shown). Metal layers, e.g., 18 and 19, are also formed on the surface, 12, of the substrate, 11, to provide electrical contact to the laser, 13, and photodiode, 14.

In order to reflect light from the laser, 13, to the photodiode, 14, with maximum efficiency, it is desirable to deposit a metal layer such as Al or Ti/Pt/Au on the walls of the channel, 17. Further, an aluminum layer is deposited in channel 15 for bonding the lens 16 to the channel. The deposition of the metal layer in channel 15 will be the focus of the remainder of the description. However, it will be realized that the invention could be used to deposit the metal layers in 17, as well as other material on a planar or nonplanar substrate.

Figure 7:
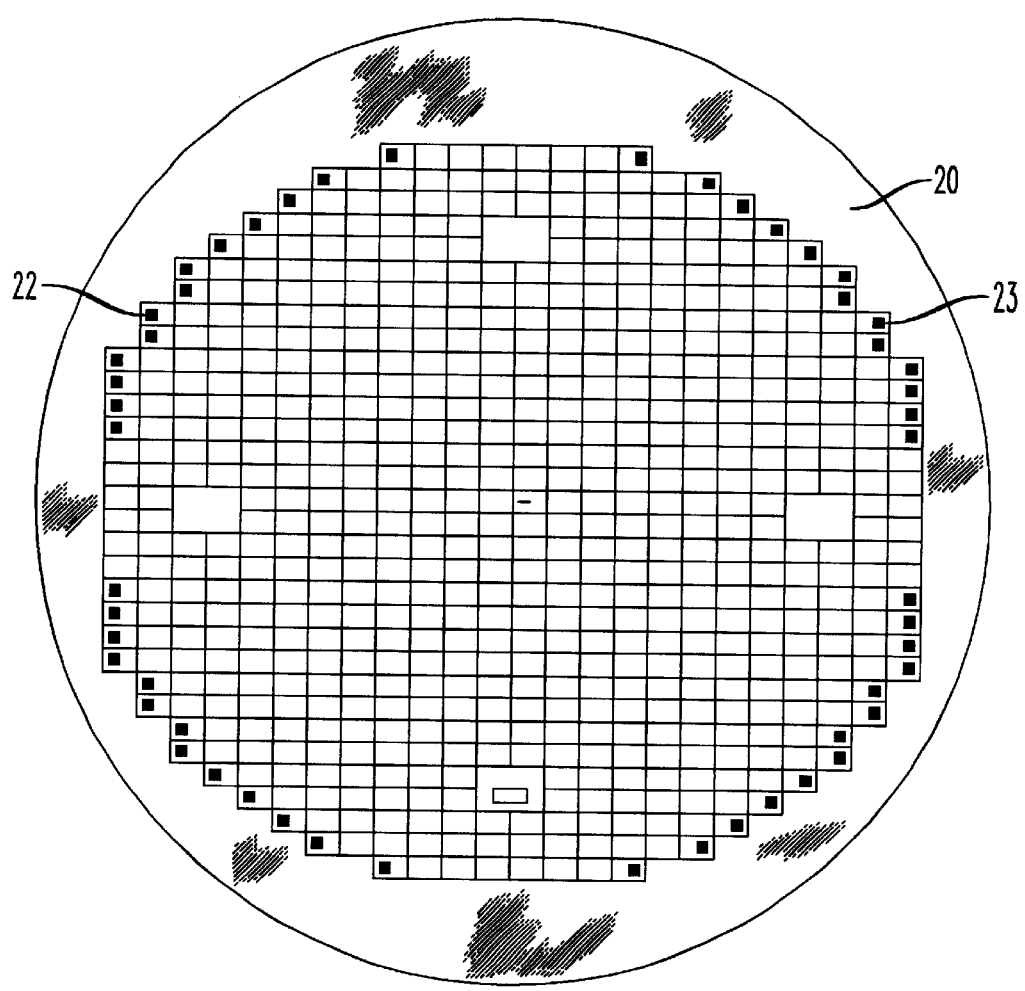
FIG. 7 is a plan view of a wafer which may be utilized to fabricate several of the subassemblies illustrated in FIG. 1.

FIG. 7 illustrates a typical silicon wafer, 20, from which several of the subassembly substrates, 12, are fabricated. Each rectangular box in the figure represents one of the substrates 12. The dark squares, e.g., 22 and 23 represent alignment features, which are discussed in more detail below.

Figure 2:
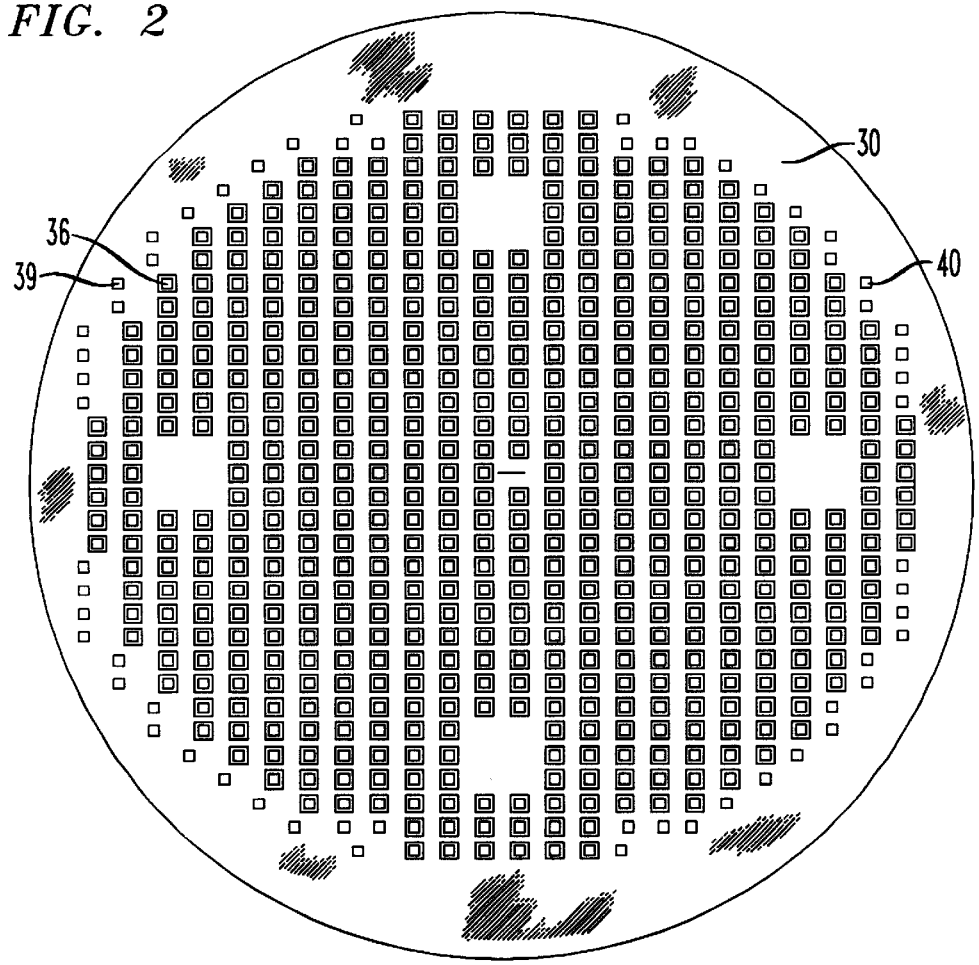
FIG. 2 is a plan view of a mask which may be utilized to fabricate several of the subassemblies illustrated in FIG. 1.

FIG. 2 illustrates a typical shadow mask, 30, used to deposit metal on to the (20) wafer. Each double square box, e.g., 36, defines what will become the metalization in channel 15 in the substrate 12, the outer box representing the position of the top of the opening in the mask (to be described) and the inner box representing the bottom of the opening. Each single box (e.g., 39) indicates the areas of the mask which include alignment features to be described. It will be appreciated that, although several alignment features are illustrated around the periphery of the mask, the invention can be practiced with a minimum of three alignment features. The major surface of the mask typically lies in the <100> crystallographic plane and is usually approx 10.2 cm (4 inches) in diameter.

Figure 3:
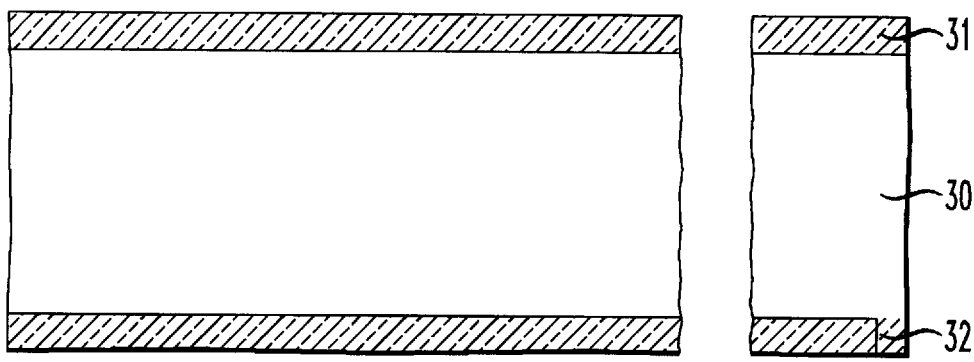
FIGS. 3–4 are cross sectional views of a portion of a mask which may be used in accordance with an embodiment of the invention during various stages of fabrication.
Figure 4:
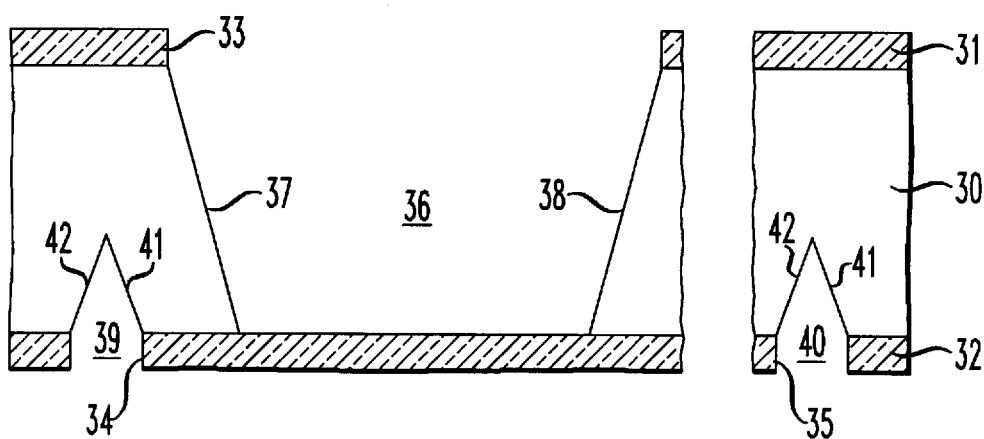

The mask can be fabricated in accordance with the steps illustrated in FIGS. 3–4. The mask, 30, comprises a semiconductor material such as silicon in the form of a substrate having approximately the same area as the wafer (20 of FIGS. 5 and 6) from which the substrates 11 are formed. The thickness of the mask is preferably in the range 500 to 800 micron.

Insulating layers, 31 and 32, which in this example are silicon dioxide, are formed by standard techniques on the major surfaces of the mask, 30, as illustrated in FIG. 3. The thickness of the layers is typically in the range 0.2 to 2 microns.

As illustrated in FIG. 4, openings, e.g., 33–35, are formed in both layers 31 and 32, by standard photolithography using an etchant such as Hydrofluoric Acid (HF). The openings, e.g., 33, in the layer 31 will define the areas of metal deposition, while the openings, e.g., 34 and 35, in the layer 32 will define alignment features to be described. One of the advantage of forming the openings on both surfaces of the substrate is the ability to align the opening 33 with the openings, 34 and 35, using a pair of masks (not shown) aligned according to standard techniques with the substrate inserted therebetween for exposing the layers 31 and 32. As also illustrated in FIG. 4, the exposed surfaces of the mask, 30, are etched using an etchant such as thylene diamine pyrocatechol (EDP). In this example, the exposed portions of the surface of the mask including the layer 31 are etched completely through the mask material, 30, to form cavities, e.g., 36, having sloping sidewalls, 37 and 38, in the 111 crystallographic planes. If it is desired to include additional features (not shown) on the other surface of the mask, the mask layer need not be etched completely through. The exposed portions of the surface of the mask including the layer 32, are etched partially through the mask to form features, 39 and 40. The features are pyramidal in shape with sidewalls, e.g., 41 and 42, in the <111> crystallographic planes. Typically, the depth of the features, 39 and 40, will be in the range 400–450 micron. After etching of the surfaces of the mask, the insulating layers, 31 and 32, are removed, for example, by HF.

Figure 5:
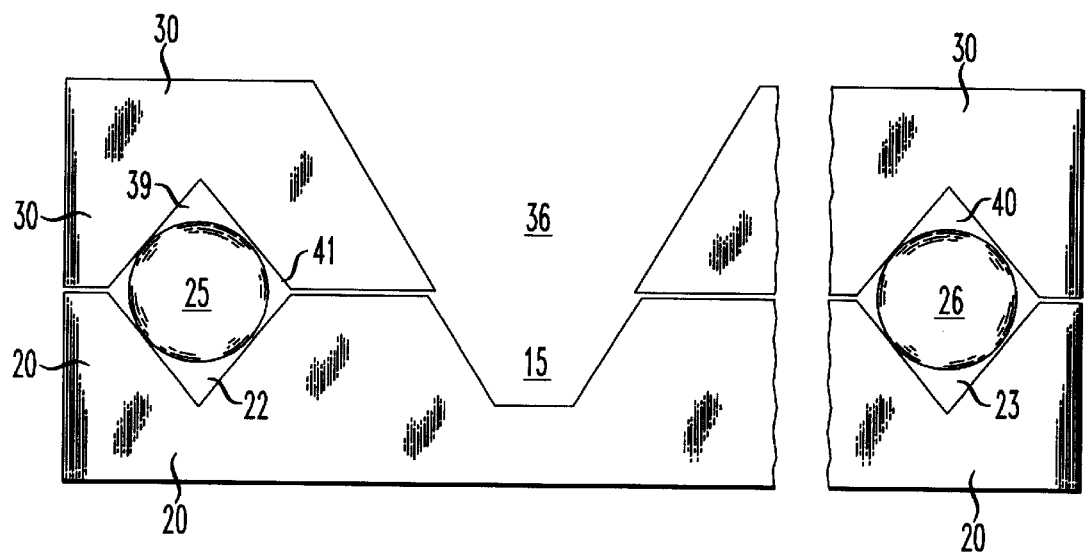
FIGS. 5 and 6 are cross sectional views of a portion of the mask and substrate during different stages of fabrication of the device of FIG. 1.
Figure 6:
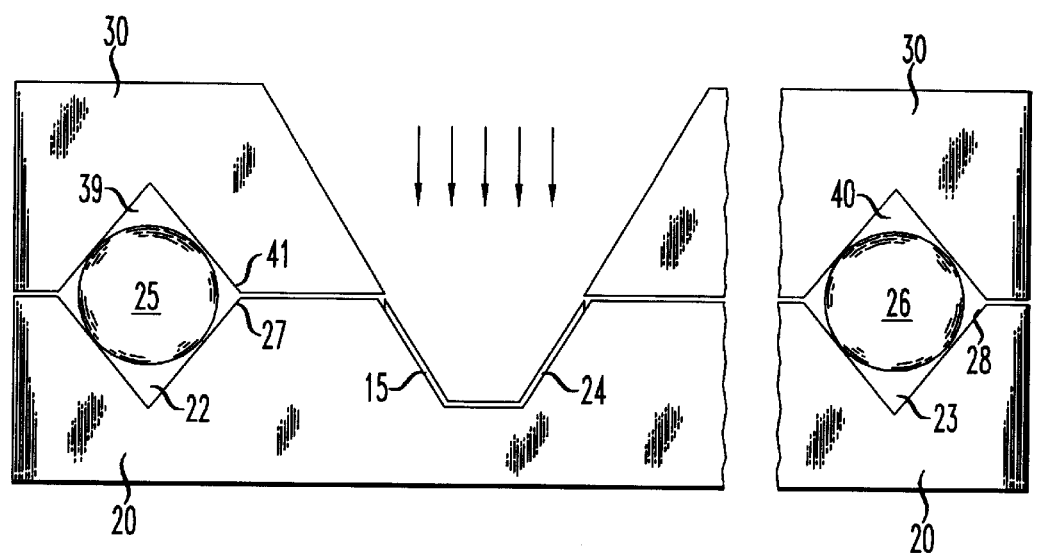

As illustrated by FIG. 5., the wafer, 20, which will form the substrate 12 includes alignment features, e.g., 22 and 23, formed in the major surface thereof which correspond to the alignment features, 39 and 40, respectively, of the mask, along with the channels, e.g., 15, which will receive the deposited material. The alignment features, 22 and 23, and channels, 15, may also be formed by standard etching using photolithographic techniques. It will be noted that the alignment features, 22 and 23, of the wafer include spherical bodies, 25 and 26, respectively, which are in physical contact with the sidewalls, e.g., 27 and 28, of the alignment features in the wafer. The sidewalls, 27 and 28, in this example are also in the <111> crystallographic planes. The bodies, 25 and 26, are placed in their respective features, 22 and 23 and the mask, 30, is then placed over the silicon wafer, 20, so that the major surface of the mask which previously included the layer, 32, is facing the major surface of the wafer, 20. Alternatively, the spheres could be initially bonded to the sidewalls, e.g., 41, of the alignment features, e.g., 39, in the mask, 30 rather than mounted in the alignment features of the wafer. The spheres, 25 and 26, are typically made of aluminum oxide, but could be made of other hard material.

In practice, an operator would place the mask, 30, on the wafer surface in general alignment with the alignment features 22 and 23 (within ±400 $\mu$m). The operator would then move the mask in the plane parallel to the major surfaces of the mask and wafer until each sphere, e.g., 25, made physical contact with the sidewalls, e.g., 41, of the alignment feature, e.g., 39, which corresponded with the alignment feature, 22, in the wafer in which the sphere was located. At this point the cavities, e.g., 36, of the mask, 30, would be precisely aligned with the channel regions, e.g., 15, of the wafer.

Once the mask, 30, is aligned with the channel regions, e.g., 15, in the wafer, the mask is clamped to the wafer by standard means such as clips or spring-loaded clamps (not shown), and the assembly is subjected to a deposition of material such as aluminum as indicated by the arrows. A typical deposition technique which can be employed is electron beam evaporation. The deposition results in the formation of a metal layer, 24, confined to the channel regions, e.g., 15, in the wafer. In this example, the layer, 24, constitutes a bonding layer which is typically 4–8 microns in thickness. As a result of the use of the alignment features in the mask and wafer, extremely tight tolerances can be achieved. Typically, registration of ±5 microns were achieved in this example.

While the invention is particularly useful for depositing a metal onto a nonplanar surface, it will be appreciated that the invention can be employed for depositing any material on a substrate which is planar or nonplanar. Various other modifications will become apparent to those skilled in the art. All such variations which basically rely on the teachings through which the invention has advanced the art are properly considered within the scope of the invention.

The invention claimed is:

1. A method of depositing a material on a substrate comprising the steps of:

providing a semiconductor mask with an aperture for defining an area of the substrate to be covered by the material, the mask further comprising a first plurality of pyramidal etched features with sidewalls in a surface of the mask;

forming a second plurality of pyramidal shaped features with sidewalls in a surface of the substrate corresponding to the first plurality of features;

mounting spheres in some of the plurality of features so that die spheres make physical contact with the sidewalls; positioning the mask so that the surfaces of the mask and substrate are facing one another, and moving the mask relative to the substrate until each sphere is positioned to contact the sidewalls in corresponding features in both the mask and substrate so that the mask is aligned with the substrate producing a registration within the range +/−5 microns; and depositing the material through the aperture in the mask.

2. The method according to claim 1 wherein the substrate comprises a nonplanar surface.

3. The method according to claim 2 wherein the material is deposited in a cavity in the surface of the substrate.

4. The method according to claim 1 wherein the substrate comprises silicon.

5. The method according to claim 1 wherein the mask comprises silicon.

6. The method according to claim 5 wherein the surface of the mask lies in the 100 crystallographic plane.

7. The method according to claim 6 wherein the sidewalls of the etched features in the mask lie in the 111 crystallographic plane.

8. The method according to claim 1 wherein the spheres comprise aluminum oxide.

* * * * *